United States Patent [19]

Baum et al.

[11] Patent Number: 5,407,710
[45] Date of Patent: Apr. 18, 1995

[54] LASER INTERCONNECTION OF CIRCUITS ON TRANSPARENT SUBSTRATE

[75] Inventors: Thomas H. Baum, San Jose; Paul B. Comita, Menlo Park; Carl E. Larson; George W. Tyndall, III, both of San Jose, all of Calif.

[73] Assignee: International Business Machines Corporation, Armonk, N.Y.

[21] Appl. No.: 101,653

[22] Filed: Aug. 4, 1993

Related U.S. Application Data

[63] Continuation of Ser. No. 869,268, Apr. 15, 1992, abandoned.

[51] Int. Cl.⁶ .............................................. B05D 3/06
[52] U.S. Cl. .................................... 427/555; 427/109; 427/124; 427/140; 427/309; 427/584; 427/586; 427/597
[58] Field of Search ............... 427/534, 554, 555, 586, 427/597, 584, 109, 124, 140, 309

[56] References Cited

U.S. PATENT DOCUMENTS

| | | | |
|---|---|---|---|
| 4,543,270 | 9/1985 | Oprysko et al. | 427/53.1 |
| 4,609,566 | 9/1986 | Hongo et al. | 427/53.1 |
| 4,636,404 | 11/1987 | Raffel et al. | 427/53.1 |
| 4,699,801 | 10/1987 | Ito et al. | 427/53.1 |
| 4,711,790 | 12/1987 | Morishige | 427/10 |
| 4,727,234 | 2/1988 | Oprysko et al. | 219/121 L |
| 4,758,533 | 7/1988 | Magee et al. | 437/173 |
| 4,778,693 | 10/1988 | Drozdowicz et al. | 427/53.1 |
| 4,822,751 | 4/1989 | Ishizu et al. | 437/173 |
| 4,880,959 | 11/1989 | Baum et al. | 219/121.85 |
| 4,902,638 | 2/1990 | Muto | 437/51 |
| 4,938,996 | 7/1990 | Ziv et al. | 427/53.1 |
| 4,948,623 | 8/1990 | Beach et al. | 427/35 |
| 4,957,880 | 11/1990 | Itoh et al. | 437/192 |
| 4,960,729 | 10/1990 | Orbach et al. | 437/101 |
| 4,968,643 | 11/1990 | Mukai | 437/174 |
| 4,976,930 | 12/1990 | Kishida et al. | 422/186.3 |

OTHER PUBLICATIONS

Kichnavek et al., "Laser Writing Metal Interconnect to Existing IC Metallization", SPIE vol. 1190, Optical Processing of Electronic Materials (1989) (no month avail.).

Ehrlich et al., J. Vac Sci. Technol., 21(1), May/Jun. 1982.

"Laser Deposition of Metal Films with Organo-Metal Ink", IBM Technical Disclosure Bulletin, vol. 31 No. 7, Dec. 1988.

Oprysko et al., "Nucleation Effects in Visible-Laser Chemical Vapor Deposition", Gould Research Center, J. Vac. Sci. Technol. B. 5 496 (1987) (no month avail.).

Primary Examiner—Bernard Pianalto
Attorney, Agent, or Firm—Robert B. Martin

[57] ABSTRACT

The present invention relates to a method for the interconnection/repair of circuits on a transparent substrate at ambient temperature using laser induced chemical vapor deposition.

3 Claims, No Drawings

LASER INTERCONNECTION OF CIRCUITS ON TRANSPARENT SUBSTRATE

This is a continuation of application Ser. No. 07/869,268 filed on Apr. 15, 1992, now abandoned.

FIELD OF THE INVENTION

The present invention relates to a method for the interconnection/repair of circuits on a transparent substrate such as thin film transistors in liquid crystal displays. The circuits are interconnected/repaired at ambient temperature using laser induced chemical vapor deposition.

BACKGROUND OF THE INVENTION

Interconnection and/or repair of circuits on a substrate is commonly required in the manufacture of electronic components such as integrated circuits, integrated circuit modules, optoelectronic modules, and liquid crystal displays ("LCDs"). Open defects may occur during manufacturing or engineering changes may be desired. To repair these defects or make changes, it is generally desired to interconnect separated circuit lines across an open region of the substrate. This can be accomplished on opaque substrates by depositing a thin metal line on the substrate to connect the separated circuit lines.

In laser-induced chemical vapor deposition ("LCVD"), a focused laser is utilized to heat the surface of an opaque substrate at an open region between two separated circuit lines in the presence of a gaseous reactive compound. The focused laser beam is absorbed by the opaque substrate to cause localized heating of the substrate. The gaseous reactive compound such as an organometallic compound, adsorbed at the laser heated surface is pyrolyzed to metal and volatile reaction products. A line of the metal is plated onto the locally heated substrate as a thin film to interconnect the separated circuit lines. Baum et al., U.S. Pat. No. 4,880,959 discloses a process where a thin film circuit is repaired by LCVD with localized heating of an opaque substrate.

However, LCVD repair of thin film circuits on LCDs is more difficult. Because the substrate is transparent to the laser beam, there is no localized heating of the substrate by the focused laser beam to cause the pyrolytic deposition of metal on the substrate. Oprysko et al. U.S. Pat. No. 4,543,270 discloses a process for repairing defects on a transparent photomask. The first step of their process involves illuminating the entire surface of the substrate with ultraviolet light to cause dissociation of a gaseous organometallic precursor of trimethyl aluminum or hexacarbonyl tungsten and the formation of a nucleation layer of the metal-containing deposit on the substrate. The laser beam is then focused onto a localized region of the nucleated surface of the substrate to cause pyrolytic decomposition of the organometallic compound and deposition of the metal on the substrate. This process is generally unsuitable for circuit repair because the resulting metal containing lines have low electrical conductivity due to carbon/oxygen incorporation into the metal. Oprysko also separately suggests nucleation of the substrate adjacent to a metal pattern heated by a laser beam with subsequent metal containing deposit on that nucleated substrate.

However, there still is a need in the art for a method to connect spaced-apart electrical circuit lines disposed on a transparent substrate.

It is, therefore, an object of the present invention to provide a method for connecting spaced-apart circuit lines disposed on a transparent substrate.

Other objects and advantages will become apparent from the following disclosure.

SUMMARY OF THE INVENTION

The present invention relates to a method for connecting spaced apart electrical circuit lines on a transparent substrate at ambient temperature comprising the steps of:

(a) contacting the substrate with a gaseous reactive metallic precursor compound;

(b) focusing a laser beam having a wavelength greater than 300 nm on one of the circuit lines to cause heating of the circuit line and deposition of metal on the circuit line and adjacent substrate; and (c) moving said focused laser beam to the other circuit line to deposit a thin film of metal on the substrate and connect the spaced-apart circuit lines.

A more thorough disclosure of the present invention is presented in the detailed description which follows.

DETAILED DESCRIPTION OF THE INVENTION

The present invention relates to a method for connecting spaced apart electrical circuit lines on a transparent substrate at ambient temperature without incident ultraviolet light. The spacing between the circuit lines can for example be due to an open defect from the manufacturing process or it can be space between two circuit lines which are to be connected to achieve a desired engineering change. The process of the present invention results in the formation of an interconnecting circuit line which has high electrical conductivity and high metallic purity substantially without any carbon/oxygen incorporation. In the preferred embodiment of the present invention, the circuit lines are part of a transistor on an LCD.

In the first step of the method of the present invention, the transparent substrate is contacted at ambient temperature (e.g. about 15° to about 25° C.) with a reactive metallic precursor compound disposed in the gas phase. Suitable transparent substrates include glass, quartz or the like which are generally transparent to the incident laser. The reactive metallic precursor compounds for use in the method of the present invention have a high vapor pressure and thermally degrade to form high purity metal substantially without carbon/oxygen incorporation. Suitable reactive metallic precursor compounds for use in the method of the present invention include tri-$C_1$–$C_4$ alkyl amine aluminum hydride (e.g. triethyl amine aluminum hydride and dimethylethyl amine aluminum hydride); tris(hexafluoroacetylacetonate) molybdenum; dicarbonyl molybdenum bis(hexafluoroacetylacetonate); tetracarbonyl molybdenum hexafluoroacetylacetonate; hexcarbonyl molybdenum; di-$C_{1-3}$ alkyl (e.g. dimethyl) gold trifluoroacetylacetonate; tri-$C_{1-3}$ alkyl (e.g. trimethyl) gold tri $C_{1-4}$ alkyl phosphine; $C_{1-3}$ alkyl (e.g. methyl) gold tri $C_{1-4}$ alkyl phosphine; palladium bis(trifluoroacetylacetonate), palladium bis(hexafluoroacetylacetonate); platinum tetrakis (trifluorophosphine) and Lewis base stabilized-copper I (B-diketonates); and copper trifluoroacetylacetonates. Other beta-diketonates of these metallic precursors and perfluoroalkyl derivatives of the above alkyl containing precursors can also be utilized in the method of the present invention as well as other reactive metallic precursor compounds which deposit high purity metal and all these compounds are contemplated as equivalent to those claimed herein. Preferred precursor compounds include dimethyl gold trifluoroacetylacetonate, triethyl amine aluminum hydride and platinum tetrakis (trifluorophosphine). The substrate is placed in a vacuum chamber and evacuated to about $10^{-4}$ to $10^{-5}$ torr. The gaseous metallic precursor compound is then introduced into the chamber and allowed to equilibrate to its ambient vapor pressure.

In some cases, prior to depositing a metal line on the substrate, it may be necessary in order to achieve good electrical contact to ablate material overlying the substrate and the circuits thereon such as electrically insulating materials (e.g., metal oxide, metal nitrides silicon oxide or nitride or polymers) or process debris. Conveniently, the overlying material maybe ablated by using a high fluence pulsed laser by art known techniques such as those disclosed in U.S. Pat. No. 4,880,959, the disclosure of which is incorporated hereinby reference. Generally, the ablation process involves focusing an excimer laser at 248 nm (or Nd-YAG at 532 or 256 nm) on the substrate (generally 10-15 nsec pulse).

The second step of the method of the present invention involves focusing a laser beam on one of the spaced-apart circuit lines which are to be connected. Preferably, in order to avoid photochemical reactions which may result in incorporation of impurities in the deposition, the laser beam has a wavelength greater than 300 nm and preferably greater than 400 nm and most preferably greater than 500 nm. Suitable laser sources include the 488 nm or 514 nm line of an argon laser; the 650 nm line from a krypton ion laser or the 532 nm line from a Nd-YAG laser. Generally, the laser beam is collimated and focused through one or more lenses onto the circuit line. For example, laser-induced deposition of gold can be achieved with the TEM$_{oo}$ mode of an argon ion laser operating at 514 nm. The 514 nm beam is expanded (typically 3X), collimated with a telescope and focused through a microscope objective (0.2 NA) onto the circuit line. The measured beam diameter is approximately 5 $\mu$m at the 1/e intensity points and has a gaussian intensity distribution. Larger or smaller beam diameter beams can also be used to vary the width of the interconnecting circuit.

The laser beam causes localized heating of the illuminated area on the circuit line to a temperature above the decomposition temperature of the gaseous metallic precursor compound. There is negligible absorption of the laser beam by the gaseous metallic precursor compound. Further, since there is negligible absorption of the laser light by the transparent substrate, there is no direct heating of the substrate. However, the localized heating of the circuit line causes indirect heating of the adjacent substrate and results in deposition of conducting metal onto the circuit line and the adjacent substrate. As the laser beam is moved slowly towards the other spaced-apart circuit line, a thin film of metal is continuously deposited onto the transparent substrate which upon reaching the other spaced-apart circuit line forms an interconnecting circuit line which electrically connects the two spaced apart circuit lines. The newly formed interconnecting circuit line has high metallic purity and has high electrical conductivity generally equivalent to conductivity of non-repaired circuits of similar dimensions (e.g. about ± 3-5%). As used herein, the phrase "laser beam is moved to the other circuit line" shall include moving the laser beam along a stationary substrate; moving the substrate past a stationary laser beam or moving both the laser beam and the substrate with respect to each other. While moving between the two spaced apart circuit lines, the laser beam may pass over materials disposed on the substrate (e.g. dielectrics SiNx or polymers) which are nontransparent or semitransparent at the laser wavelength.

The method of the present invention can be used to repair the following type of defect or make the following types of engineering changes.

1. Defect due to missing metallurgy, causing an open circuit (e.g. in a data or gate line driver). The void or crack in the metallurgy may be a result of particles present during the metallization step, defects from the photolithographic processing, handling of the circuitry resulting in removal of some portion of the metallurgy, or the like.
2. Regions of very high resistance in the metallurgy, such as partially voided regions where the circuit necks down or where particles are present in the circuit line. The lines may be continuous, but for the purposes of a working display with specific refresh or sweep frequencies the lines may be defective.
3. Short circuits between adjacent data or gate line, or between data and gate lines at the crossover regions. In these cases, the short circuit region is removed from the data and gate lines, for example by laser ablation, and then, in most cases, the upper data line will be reconnected by the process of the present invention.
4. Rewiring to avoid defective driver circuitry. In these cases, the driver circuit is removed, for example by laser ablation, and a working circuit is connected to the gate or data line by the process of the present invention.

The following examples are detailed descriptions of methods of the present invention. The detailed methods fall within the scope of, and serve to exemplify, the more generally described methods set forth above. The examples are presented for illustrative purposes only, and are not intended as a restriction on the scope of the invention. All temperatures are in degrees Celsius.

EXAMPLE 1

A circuit data line consisting of layered Mo/Al/Mo metal on an active matrix thin film transistor array has a 20 $\mu$m void. The substrate is placed in a vacuum chamber with a transparent window and evacuated to $1 \times 10^{-5}$ torr. Triethylamine aluminum hydride is introduced into the cell at its ambient vapor pressure (0.4 torr). An argon ion laser beam (514 nm) focused to 5 $\mu$m measured by intensity at the 1/e points is directed to one end of the circuit line and scanned twice across the opening to the other circuit line at 40 $\mu$m/sec and scanned 4 times at a rate of 75 $\mu$m/sec. The newly deposited circuit has a resistance of 3.81 ohms which is within 5% of the resistance of unrepaired data lines having the same dimension and geometry.

EXAMPLE 2

A circuit (50 $\mu$m width) on the quartz substrate of an optoelectronic integrated packaging module had an open defect (300 $\mu$m). Following the procedure of Example 1 with dimethyl gold hexafluoroacetylacetonate (0.04 torr) as the precursor, the defect was repaired with an argon laser (100 mW; 514 nm; 5 μm at 1/e point) with scan velocity of 100 μm/sec. The repaired circuit had a resistance of 10 ohms which is within 5% of the resistance of unrepaired data lines having the same dimension and geometry.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A method for connecting spaced apart circuit lines at ambient temperature on a transparent substrate of a liquid crystal display which has negligible absorption of incident laser light comprising the steps of:
   a. contacting the substrate with a gaseous metallic precursor compound selected from tri-$C_{1-3}$ alkyl amine aluminum hydride; tris(hexafluoroacetylacetonate) molybdenum; dicarbonyl molybdenum bis(hexafluoroacctylacetonate); tetracarbonyl molybdenum hexafluoroacetylacetonate; hexacarbonyl molybdenum; di-$C_{1-3}$ alkyl gold trifluoroacetylacetonate; tri-$C_{1-3}$ alkyl gold tri $C_{1-4}$ alkyl phosphine; $C_{1-3}$ alkyl gold tri $C_{1-4}$ alkyl phosphine; palladium bis(hexafluoroacetylacetonate); palladium bis(trifluoroacetylacetonate), platinum tetrakis (trifluorophosphine), copper I (B-diketonate) or copper trifluoroacetylacetonates:
   b. focusing a laser beam having a wavelength greater than 300 nm on one of the circuit lines to cause heating of the circuit line and deposition of metal on the circuit line and adjacent substrate; and
   c. moving said focused laser beam to the other circuit line to deposit metal on the substrate and connect the circuit lines.

2. The method of claim 1 wherein the metallic precursor compound is selected from dimethyl gold trifluoroacetylacetonate, triethyl amine aluminum hydride or platinum tetrakis (trifluorophosphine).

3. The method of claim 1 further comprising the step of ablating material from the substrate prior to contacting the substrate with the gaseous metallic precursor.

* * * * *